United States Patent
Shimabukuro et al.

(10) Patent No.: US 6,521,950 B1
(45) Date of Patent: *Feb. 18, 2003

(54) ULTRA-HIGH RESOLUTION LIQUID CRYSTAL DISPLAY ON SILICON-ON-SAPPHIRE

(75) Inventors: Randy L. Shimabukuro, San Diego, CA (US); Stephen D. Russell, San Diego, CA (US); Bruce W. Offord, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/086,952

(22) Filed: Mar. 1, 2002

Related U.S. Application Data

(63) Continuation-in-part of application No. 09/607,438, filed on Jun. 29, 2000, now Pat. No. 6,365,936, and a division of application No. 08/301,170, filed on Sep. 1, 1994, now abandoned, and a continuation-in-part of application No. 08/105,252, filed on Aug. 4, 1993, now abandoned, and a division of application No. 08/094,541, filed on Jun. 30, 1993, now Pat. No. 5,300,443.

(51) Int. Cl.$^7$ .......... H01L 27/01; H01L 27/12; H01L 31/0392
(52) U.S. Cl. .......... 257/350; 257/59; 257/72
(58) Field of Search .......... 257/350, 59, 72

(56) References Cited

U.S. PATENT DOCUMENTS

| | | | | |
|---|---|---|---|---|
| 5,973,363 A | * | 10/1999 | Staab et al. | 257/347 |
| 6,365,936 B1 | * | 4/2002 | Shimabukuro et al. | 257/350 |
| 6,391,690 B2 | * | 5/2002 | Miyasaka | 438/149 |
| 6,447,938 B1 | * | 9/2002 | Bianchi | 428/698 |

* cited by examiner

*Primary Examiner*—Ngân V. Ngô
(74) *Attorney, Agent, or Firm*—Michael A. Kagan; James A. Ward; Peter A. Lipovsky

(57) ABSTRACT

A liquid crystal display includes: a) a sapphire substrate having a first crystal lattice structure; b) a single crystal silicon structure having a thickness no greater than about 100 nanometers affixed to the sapphire substrate to create a silicon-on-sapphire structure, and a second crystal lattice structure oriented by the first crystal lattice structure; c) an array of liquid crystal capacitors formed on the silicon-on-sapphire structure; and d) integrated circuitry formed from the silicon layer which is operably coupled to modulate the liquid crystal capacitors. The liquid crystals capacitors may include nematic or ferroelectric liquid crystal material.

9 Claims, 7 Drawing Sheets

ULTRA-HIGH RESOLUTION LIQUID CRYSTAL DISPLAY ON SILICON-ON-SAPPHIRE

CROSS REFERENCE TO RELATED APPLICATIONS

This application is a continuation-in-part of U.S. patent application Ser. No. 09/607,438 (Navy Case No. 82544) filed Jun. 29, 2000 now U.S. Pat. No. 6,365,936, entitled "Ultra-High Resolution Liquid Crystal Display on Silicon-On-Sapphire;" a continuation-in-part of U.S. patent application Ser. No. 08/105,252 (Navy Case No. 73,925) filed Aug. 4, 1993, entitled "Ultra-High Resolution Liquid Crystal Display on Silicon-On-Sapphire," now abandoned; a divisional of U.S. patent application Ser. No. 08/301,170 (Navy Case No. 74,146) filed Sep. 1, 1994, entitled "Method for Fabricating Electrically Addressable Silicon-On-Sapphire Light Valve," now abandoned;" and a continuation-in-part of U.S. Ser. No. 08/094,541, now U.S. Pat. No. 5,300,443, filed Jun. 30, 1993 (Navy Case No. 73,899), entitled "Method for Fabricating Complementary Enhancement and Depletion Mode Field Effect Transistors on a Single Substrate."

BACKGROUND OF THE INVENTION

Liquid crystal displays are used in a wide variety of commercial applications including portable (laptop) computers, wristwatches, camcorders and large screen televisions. Liquid crystal light valves, used as spatial light modulators, may be used in projection systems as well as optical computing applications. Limitations inherent in the existing technology come from the necessity of fabricating the displays on transparent glass or quartz substrates which are not amenable to high quality electronic materials. Fabrication of displays on bulk silicon, although of high crystal quality, unnecessarily constrains the display to reflective mode schemes due to the opaque substrate and is not applicable to transmissive applications. The ability to integrate drive circuitry using thin-film transistors (TFTs) with liquid crystal displays has improved reliability and has allowed the use of this technology in lightweight, portable applications. However, the integration of display driving circuitry heretofore has been substantially limited to thin film transistor technology using amorphous (a-Si) or polycrystalline (p-Si) silicon deposited on the glass or quartz substrate. The intrinsic properties such as lattice and thermal mismatch between the silicon layer and the substrate, and the low temperature deposition techniques used in the a-Si and p-Si technologies result in a silicon layer with poor charge carrier mobility and crystallographic defects. These limitations are directly related to inferior electronic device performance and limitations when compared to bulk silicon.

Of particular importance for integrated display systems is the desire for higher density circuitry for ultra-high resolution display and light valve applications and for the monolithic integration of display driver circuitry and related signal processing circuitry on-chip. The characteristic lower (electrical and crystallographic) qualities of a-Si and p-Si materials result in poor fabrication yields when compared to conventional Very Large Scale Integration (VLSI) processing. Overcoming this problem, inherent in the poorer quality amorphous or polycrystalline material, requires the use of redundant circuit elements in each pixel to ensure fully functional displays in a-Si and p-Si. This redundancy requires an concomitant increase in the picture element (pixel) size thereby inhibiting the ability to scale displays and light valves to ultra-high resolution. The additional circuit elements also reduce the aperture ratio, i.e. the fraction of pixel area allowing transmitted light, thereby reducing the brightness of the display or light valve.

Furthermore, the low carrier mobility, low speed, low yield a-Si and p-Si materials are incompatible with VLSI design and fabrication techniques which would otherwise readily allow integration of video drivers, digital logic and other computational circuitry on-chip thereby offering designers greater functionality, higher reliability, and improved performance.

Thus, a need has been recognized for an electrically addressable ultra-high resolution nematic liquid crystal display or light valve system which monolithically integrates an active matrix display with its associated drive and image processing circuitry.

SUMMARY OF THE INVENTION

The present invention is directed to an ultra-high resolution liquid crystal display that includes liquid crystals and integrated control circuitry formed from a thinned layer of single crystal silicon. The liquid crystal display includes: a) a sapphire substrate having a first crystal lattice structure; b) a single crystal silicon structure having a thickness no greater than about 100 nanometers affixed to the sapphire substrate to create a silicon-on-sapphire structure, and a second crystal lattice structure oriented by the first crystal lattice structure; c) an array of liquid crystal capacitors formed on the silicon-on-sapphire structure; and d) integrated circuitry formed from the silicon layer which is operably coupled to modulate the liquid crystal capacitors. The liquid crystals capacitors may include nematic or ferroelectric liquid crystal material.

The thinned layer of single crystal silicon supports the fabrication of device quality circuitry on the silicon-on-sapphire structure which is used to control the operation of the pixels that may be individually addressed to create an image. The types of liquid crystal capacitors that may be fabricated in conjunction with the invention may be ferroelectric liquid crystal capacitors and nematic liquid crystal capacitors.

These and other advantages of the invention will become more apparent upon review of the following specification, including the claims, and the accompanying figures.

BRIEF DESCRIPTION OF THE DRAWINGS

Throughout the drawings, like elements are referenced using like designations.

DISCLOSURE OF THE PREFERRED EMBODIMENT

The present invention provides a liquid crystal array display which avoids the inherent leakage problems in SOS devices by using ferroelectric liquid crystals (FLCs). The circuit architecture for driving bistable FLC materials avoids the requirement for having stringent, low leakage in SOS circuits. Another embodiment of the present invention improves the device performance and pixel architecture of the SOS circuit elements such that the requirement of using bistable FLCs is removed and conventional nematic liquid crystals can be suitably integrated for high-density displays.

Figure 1:
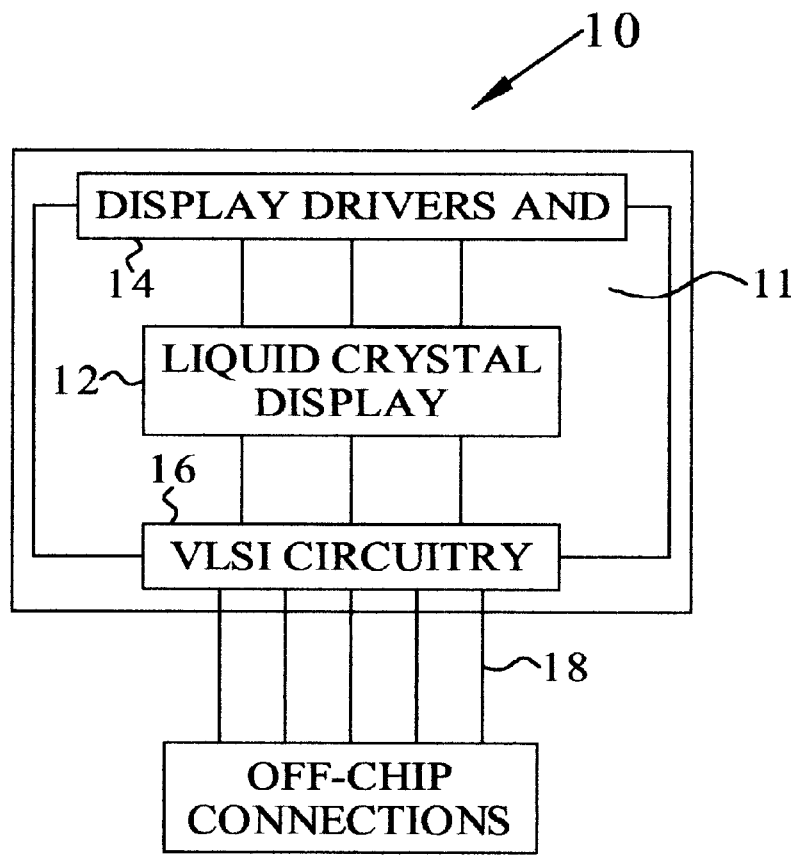
FIG. 1 schematically shows a nematic liquid crystal display monolithically integrated with associated circuitry on an improved-UTSOS wafer.

FIG. 1 schematically shows a display system 10 having the top view nematic liquid crystal display 12 monolithically integrated with associated circuitry 14 and 16 on an improved, ultra-thin silicon-on-sapphire (UTSOS) wafer. Display drivers 14 and very large scale integration (VLSI) circuitry 16 are used to address each of the individual pixels 20 and to apply appropriate voltages to modulate liquid crystal capacitor 24 to represent an image presented by liquid crystal display 12. Typically, display drivers 14 include shift registers, and clock circuitry. VLSI circuitry 16 may include image processing circuits, memory and buffer circuits, wireless interconnect circuitry and the like. A display area 12 in display or light valve system 10 has an array of one or more pixel elements which may be individually addressed so that display 12 presents an image for viewing or projection. By way of example, a 1000 pixel×1000 pixel display is described by way of example only. However, it is to be understood that the scope of the invention includes liquid crystal displays having any number of liquid crystals as may be required to suit the needs of a particular application.

Figure 2:
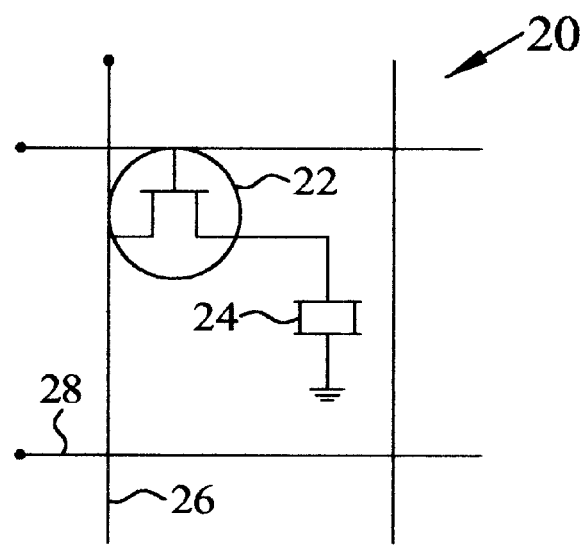
FIG. 2 shows the electrical schematic for a single picture element (pixel).
Figure 10:
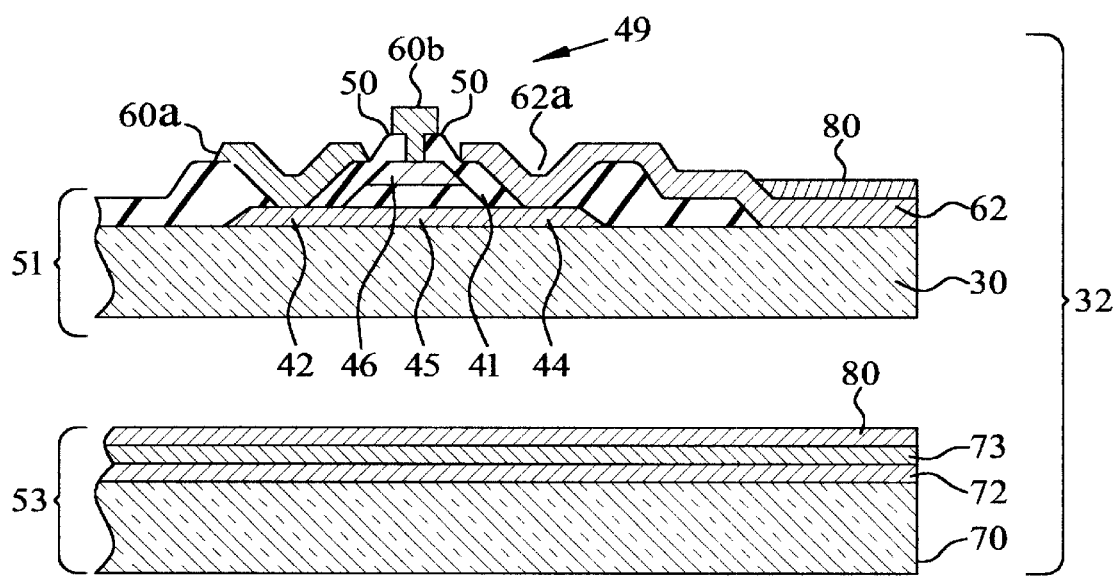
Figure 11:
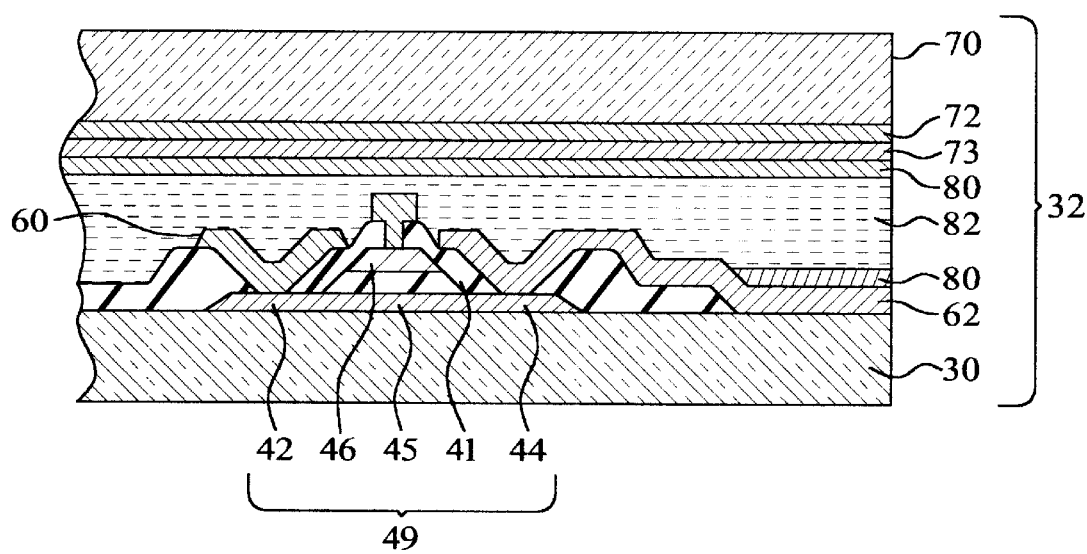
Figure 12:
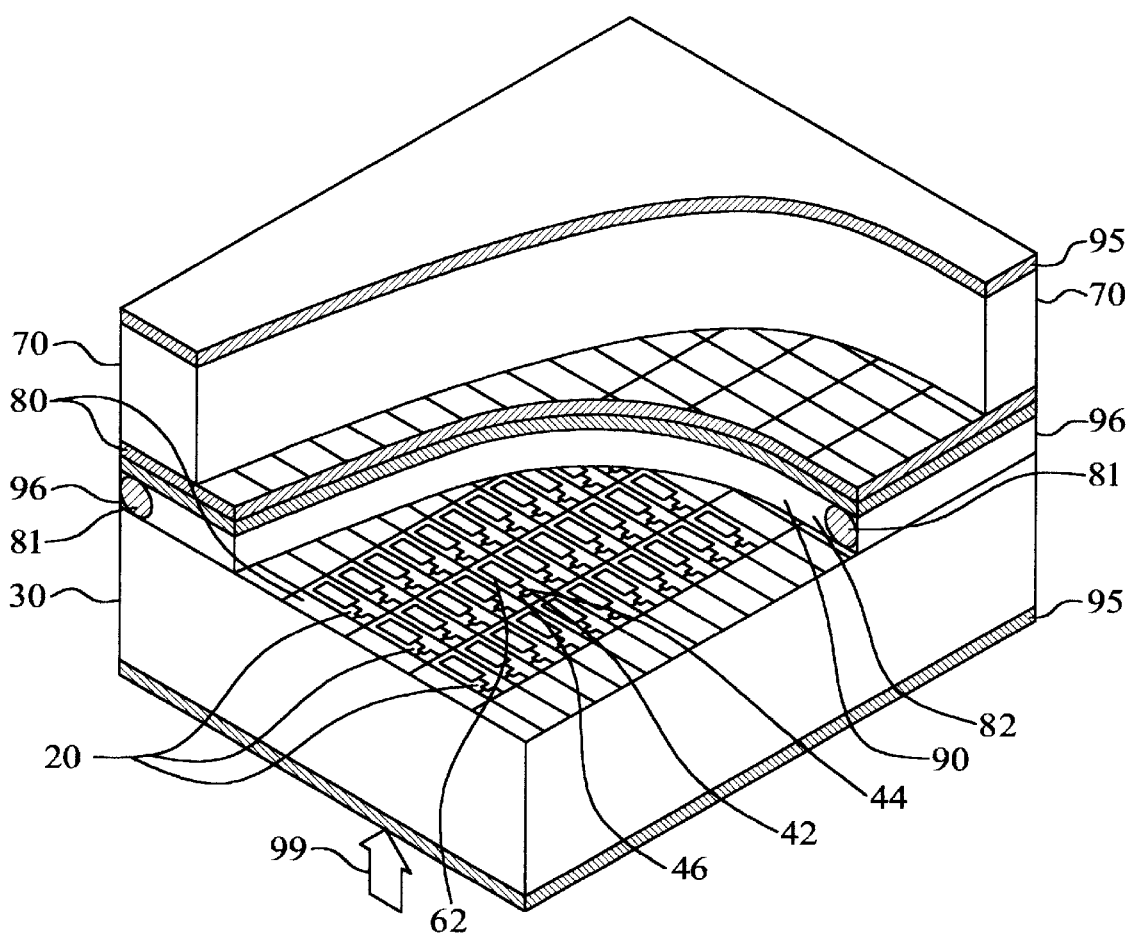

For purposes of illustrating the manufacture of the invention, fabrication of only the simplest pixel element is described. Each pixel element includes a single nonlinear circuit element and a single nematic liquid crystal capacitor. As detailed below, a plurality or multitude of such pixels may be configured and interconnected in an array with drive and image processing circuitry using standard photolithographic processess. FIG. 2 shows an electrical schematic for a single liquid crystal display element 20 which includes a nonlinear circuit element 22, such as a MOSFET, and a single nematic liquid crystal capacitor 24. Metal column line 26 and polysilicide row line 28 are appropriately connected to bias the nonlinear circuit element 22 to vary the voltage of the nematic liquid crystal 24 to achieve a desired gray scale. FIGS. 10, 11, and 12 show the steps for fabricating a single liquid crystal display element 20 and non-linear circuit element 22.

Figure 3:
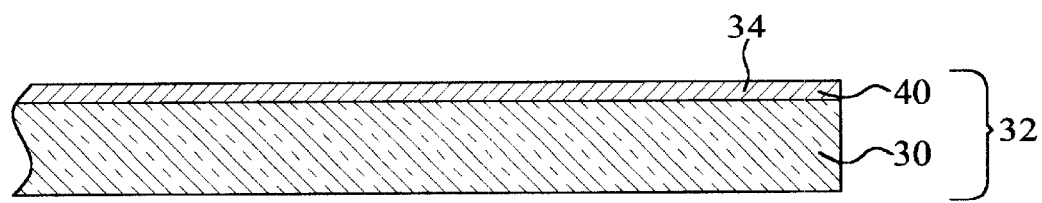
FIG. 3 shows the crystal structure of sapphire.

Referring to FIG. 3, a single crystal silicon layer 40 is affixed to a sapphire ($Al_2O_3$) substrate 30 to create a silicon-on-sapphire (SOS) wafer 32, where wafer 32 represents the various manufactured stages of the structure being fabricated into liquid crystal display 20. One method for affixing silicon layer 40 to sapphire substrate 30 is by epitaxial deposition of a single crystal layer of silicon onto sapphire substrate 30. Epitaxial deposition of single crystal silicon layer 40 is achieved by thermal decomposition of silane onto sapphire substrate 30 in accordance with well known techniques.

Figure 4:
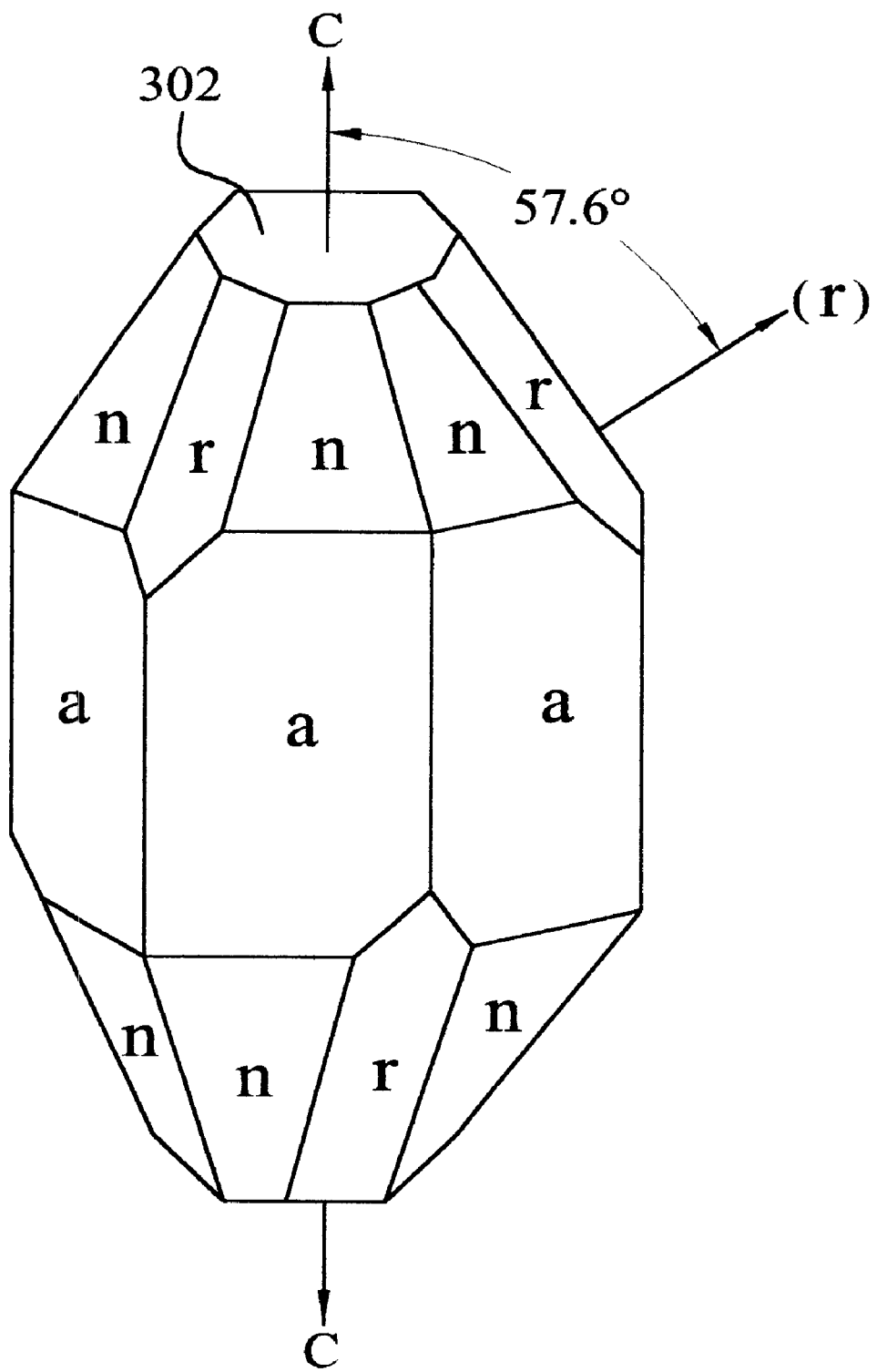
FIG. 4 shows a silicon crystal formed on the r-plane of the sapphire crystal shown in FIG. 3.
Figure 5:
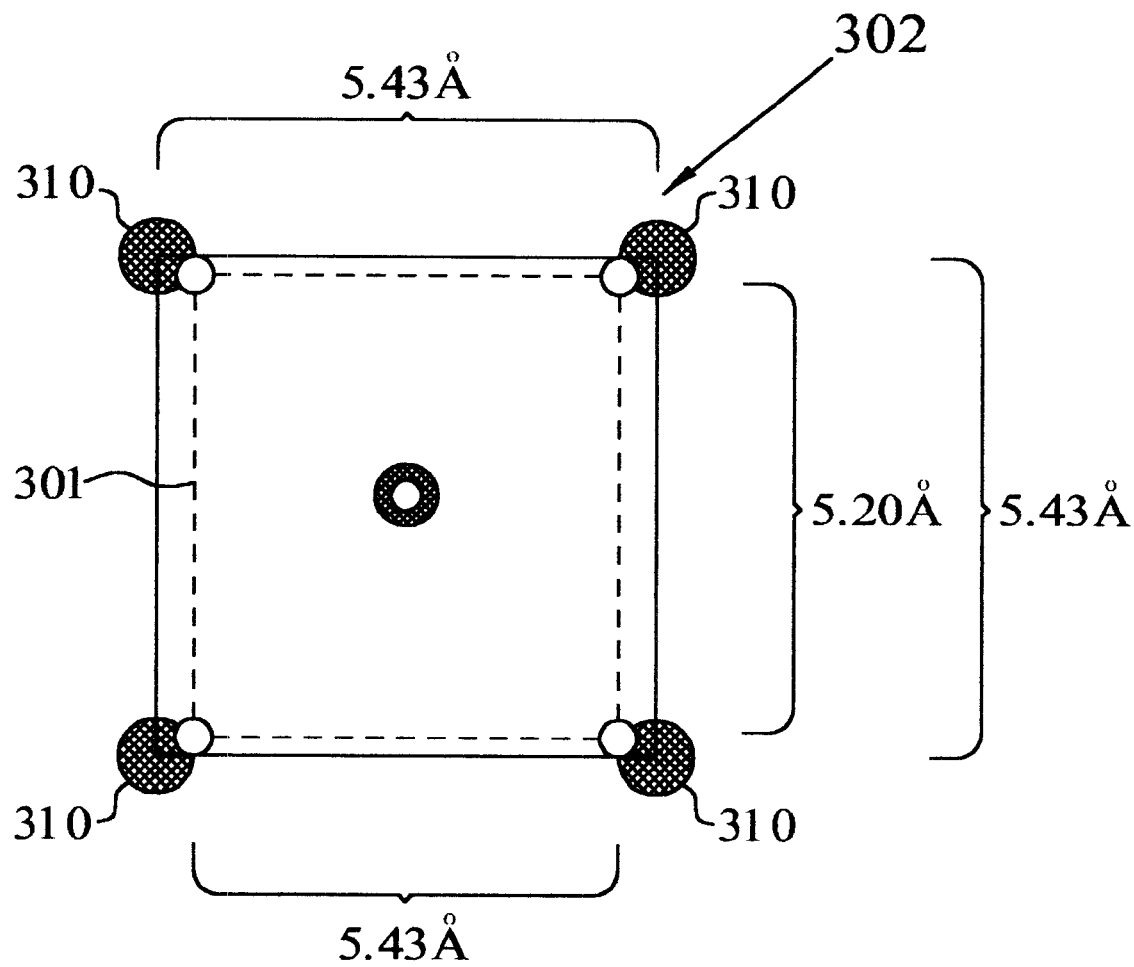

As shown in FIG. 4, a sapphire crystal 300 has a rhombohedral structure 302 with hexagonal symmetry along the c-axis. Due to the hexagonal symmetry, the sapphire crystal 300 is often described using hexagonal coordinates rather than the standard crystallographic Miller indices. Thus, the c-axis of sapphire is written as (0001). The crystalline structure of silicon and sapphire are not the same, therefore hetero-epitaxy of silicon on sapphire is not inherently plausible due to substantial crystalline, lattice and thermal expansion coefficient mismatch. However, thin films of single-crystal silicon have been fabricated on certain sapphire crystal planes that have a compatible, although not identical, crystal structure. Compatible crystal structures refer to a single crystal of a first material such as silicon that is capable of being formed on a single crystal of a second material such as sapphire. The r-plane of sapphire crystal 300, shown in FIG. 3 below, and denoted by ($\bar{1}102$) is one type of crystal structure on which single crystal silicon may be grown. FIG. 4 schematically shows a top view of a (100)-oriented silicon layer 301 formed on r-plane sapphire crystal 300. The silicon layer 301 has a lattice spacing of 5.43 Å that includes silicon atoms 310. The relative lattice spacing of r-plane sapphire crystal 300, containing aluminum atoms 310 shows a lattice spacing of 4.75 Å along the ($11\bar{2}0$) direction and 5.20 Å along the ($\bar{1}101$) direction. Therefore, there is a lattice mismatch of 4.2% along the ($\bar{1}101$) direction and a lattice mismatch of 12.5% along the ($11\bar{2}0$) direction.

This lattice mismatch and the thermal expansion mismatch between the sapphire crystal 300 and silicon crystal 301 lead to crystalline defects (twins and dislocations) in silicon layer 40 that detrimentally effect electronic device performance. The concentration of defects is much higher near the silicon/sapphire interface 34 and decreases in a direction into silicon layer 40, away from the silicon/sapphire interface 34. Thus, it is important to improve the quality of the silicon layer 40 in order to eliminate all or most of the defects in order to obtain a single crystal silicon layer or structure having optimized properties such as a low concentration of twin defects, threading dislocations, high charge carrier mobility, and longer carrier lifetime. An example of a process for improving the quality of the silicon layer 40 is known as solid phase epitaxial regrowth. Alternatively, single crystal silicon layer 40 may be made from a single crystal silicon structure that is bonded to sapphire substate 30, as described in commonly assigned U.S. Pat. No. 5,441,591, incorporated herein by reference.

Silicon layer 40 then is ion implanted with $^{28}Si$ atoms (doses on the order of $10^{14} cm^{-2}$ at 185 keV) into the near interfacial region of the silicon-sapphire interface 34 while the temperature of wafer 32 is maintained at −20 degrees C. Ion implanting other isotopes species of silicon such as $^{29}Si$ and $^{30}Si$ may also be employed in the practice of the present invention. Species of substantially different masses such as ions or complexes of tin (Sn), germanium (Ge) or carbon (C) may also be used by appropriately varying the implant parameters.

After being ion-implanted, silicon layer 40, ergo wafer 32, is thermally soaked for about 30 minutes at 550° C., where after the temperature is ramped upwardly over the course of an hour from 550° C. to 900° C. Next, silicon layer 40 is thermally annealed at 900° C. in nitrogen for approximately one hour. A gradual anneal of silicon layer 46 allows the silicon layer 40 to regrow as a single crystal having minimal defects, and avoids subjecting the silicon layer 40 to thermal shock. Then silicon layer 40 is oxidized at 1000° C. in order for a portion of silicon layer 40 to transformed into oxide. The oxide is subsequently etched.to reduce the thickness of silicon layer 40. The oxidation and etch process of silicon layer 40 may be repeated as required until silicon layer 40 has a thickness generally in the range of about 30 to less than 100 nm. The thinned, single crystal silicon layer 40 offers substantial improvement in absorption (i.e. increased brightness), resistance to heating, and parasitic photoexcited carriers compared to such properties of thicker silicon structures.

Figure 6:
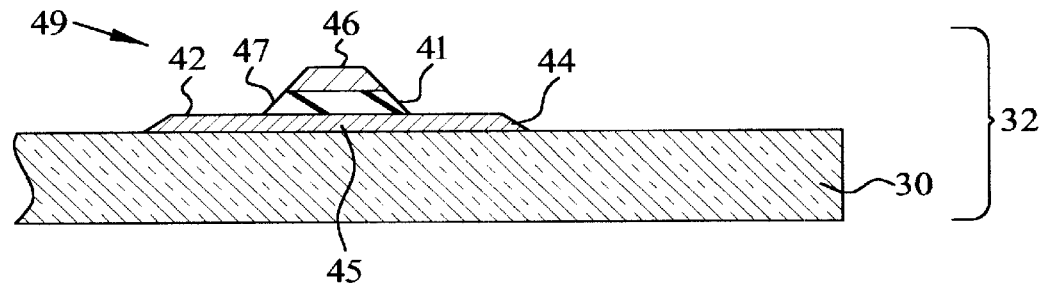
FIGS. 5–12 schematically show the integrated fabrication process for a liquid crystal display and associated circuitry that embodies various features of the present invention.

Next, the single nonlinear circuit element 22, such as a MOSFET, is fabricated on the thinned and patterned silicon layer 40 using well known photolithographic techniques to create the MOSFET structure 49 shown in FIG. 6. MOSFET structure 49 includes gate oxide 41, source region 42, drain region 44, channel region 45, gate electrode 46 and sidewall oxide 47, where source region 42, drain region 44, and channel region 45 are formed from patterned single crystal silicon layer 40.

Figure 7:
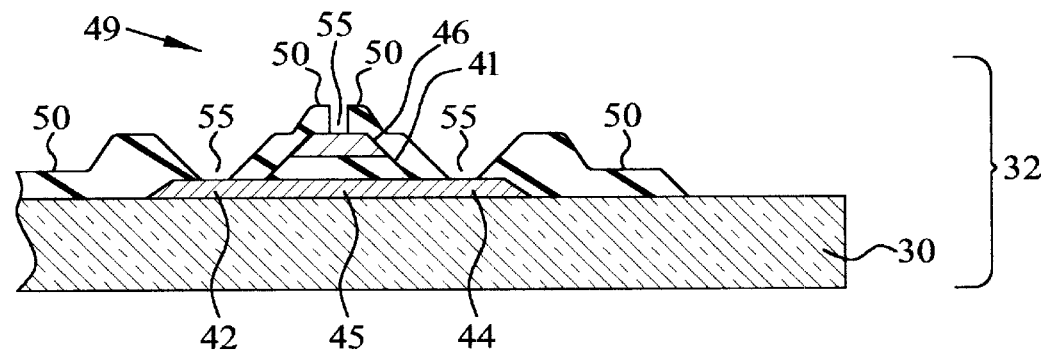

The fabrication of pixel element 20, and particularly that of MOSFET structure 49 on wafer 32, continues by chemical vapor deposition (CVD) and selective etching of passivation oxide layer 50 onto wafer 32 as shown in FIG. 7. After formation of passivation oxide layer 50, contact holes 55 are patterned in passivation oxide layer 50 to expose selected areas of source region 42, drain region 44 and gate region (via gate electrode 46).

Figure 8:
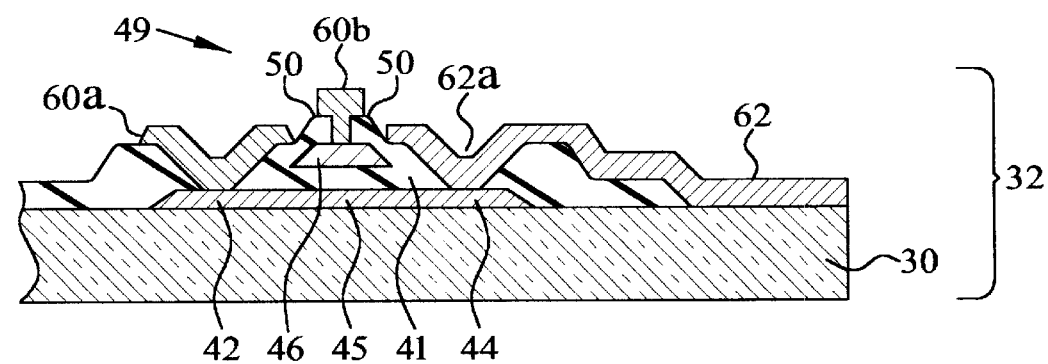

Depositing and patterning interconnect metallization layer 62 onto wafer 32 to create contacts 60a, 60b, and 62a to source region 42, gate electrode 46, and drain region 44, respectively to provide wafer 32 with the structure shown in FIG. 8. The interconnect metallization layer 62 may be fabricated using a multiple step process. For example, an aluminum alloy (99%Al:1%Si) may be deposited and patterned for all contacts including source contact 60a, gate contact 60b, and interconnections with silicon MOSFETs and related devices and circuits. A transparent conductive material such as indium tin oxide (ITO) may be subsequently deposited and patterned as a transparent drain contact 62a that also extends as a transparent nematic liquid crystal capacitor contact or electrode 62 for a nematic liquid crystal capacitor to be described, (the interconnect metallization also forms the output electrode from the MOSFET to pixel electrode 62). The transparent nematic liquid crystal capacitor electrode 62 may be employed when the display system 10 is used in a transmissive mode. However, for a reflective mode display or light-valve system, the nematic liquid crystal capacitor electrode may be an opaque metal (such as Al or 99%Al:1%Si) as this forms a back reflector for the system.

Figure 9:
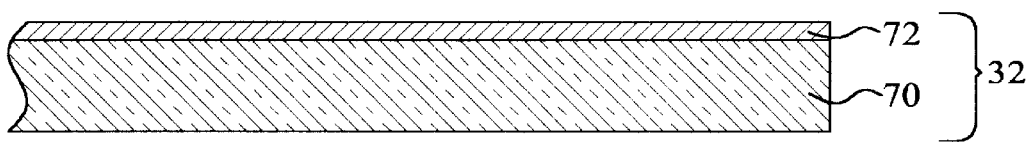

At this stage of the process, the monolithically integrated circuitry, display drivers 14 and VLSI circuitry 16, including the non-linear circuit element 22 within the each pixel 20 are completely fabricated and may, if desired, be covered with additional passivation, shielding or planarization layers useful in certain applications. For example, as shown in FIG. 9, a transparent substrate 70, e.g. sapphire, quartz, fused silica or glass, may be covered with a transparent metallized counter electrode 72, and appropriately patterned. Counter electrode 72 is normally common for the entire array of pixels 20 of crystal display 12. Referring to FIG. 10, wafer structure 32 now includes wafer subassemblies 51 and 53. Pixel 20 may be fabricated to provide a colored display by attachment of a suitably colored optical filter layer 73 to counter electrode 72. Next, alignment layer 80 then may be formed on filter layer 73 to pin one end of liquid crystal 82 to surface of alignment layer 80 to allow uniform rotation of the liquid crystal 82 when subjected to a voltage bias, therefore uniformly affecting the retardation of the polarized light that is transmitted through the liquid crystal capacitor 24. Formation of alignment layer 80 may be achieved by depositing a thin polyimide layer 80 on, inter alia, optical filter layer 73 and pixel electrode 62 which is subsequently mechanically rubbed to obtain a preferred orientation for the liquid crystal media.

A method for spacing each pixel electrode 62 from counter electrode 72 employs fiber glass spacer rods or beads 81 (FIG. 12) to form a cavity between structures 51 and 53 shown in FIG. 10. Spacer rods 81 normally lie at the periphery of wafer 32. Referring to FIGS. 11 and 12, final assembly of liquid crystal display 10 requires appropriately aligning and positioning substrate 30 with respect to substrate 70 so as to form a cavity 82 which is filled with a desired liquid crystal material 90 such as a nematic liquid crystal material or a ferroelectric crystal material. Cavity 82 is then hermetically sealed or plugged with flat closures 96. One skilled in the art to which this invention pertains would be apprised of appropriate closure configurations and techniques for accomplishing same.

Affixing appropriately oriented polarizers 95 to transparent substrate 70 completes the fabrication of the monolithic liquid crystal display system 10, which as shown in FIG. 12, includes pixel elements 20 arranged in an array.

Obviously, numerous modifications and variations of the present invention are possible in light of the above teachings. It is therefore understood that within the scope of the appended claims the invention may be practiced otherwise than as specifically described herein.

We claim:

1. A liquid crystal display, comprising:

a sapphire substrate having a first crystal lattice structure;

a single crystal silicon structure having a thickness no greater than about 100 nanometers affixed to said sapphire substrate to create a silicon-on-sapphire structure, and a second crystal lattice structure oriented by said first crystal lattice structure;

an array of liquid crystal capacitors formed on said silicon-on-sapphire structure; and integrated circuitry formed from said silicon layer which is operably coupled to modulate said liquid crystal capacitors.

2. The liquid crystal display of claim 1 wherein said sapphire substrate has an r-plane orientation and said single crystal silicon structure has a (100)-orientation.

3. The liquid crystal display of claim 1 wherein each of said liquid crystal capacitors is coupled to a transistor formed on said silicon-on-sapphire substrate.

4. The liquid crystal display of claim 3 wherein each of said liquid crystal capacitors is a nematic liquid crystal capacitor.

5. The liquid crystal display of claim 4 wherein said liquid crystal capacitor provides a reflective pixel element.

6. The liquid crystal display of claim 4 wherein said liquid crystal capacitor provides a pixel element that is transmissible to light.

7. The liquid crystal display of claim 1 wherein each of said liquid crystal capacitors is a ferroelectric liquid crystal capacitor.

8. The liquid crystal display of claim 7 wherein said liquid crystal capacitor provides a reflective pixel element.

9. The liquid crystal display of claim 7 wherein said liquid crystal capacitor provides a pixel element that is transmissible to light.

* * * * *